United States Patent
Uchino et al.

[11] Patent Number: 5,851,449
[45] Date of Patent: Dec. 22, 1998

[54] METHOD FOR MANUFACTURING A SURFACE-MOUNTED TYPE OPTICAL SEMICONDUCTOR DEVICE

[75] Inventors: Tuguo Uchino, Yokohama; Iwao Matumoto, Fujisawa; Hiroshi Nagasawa, Kitakyushu, all of Japan

[73] Assignee: Kabushiki Kaisha Toshiba, Kawasaki, Japan

[21] Appl. No.: 721,015

[22] Filed: Sep. 26, 1996

[30]     Foreign Application Priority Data

Sep. 27, 1995  [JP]  Japan ................................. 7-249532

[51] Int. Cl.⁶ ..................................................... B29D 11/00
[52] U.S. Cl. ...................... 264/1.7; 264/1.9; 264/272.15; 264/272.17; 264/328.4
[58] Field of Search ............................... 264/1.7, 1.9, 1.1, 264/272.11, 272.14, 272.15, 272.17, 328.4

[56]              References Cited

U.S. PATENT DOCUMENTS

| | | | |
|---|---|---|---|
| 4,292,735 | 10/1981 | Thillays | 264/1.9 |
| 4,822,536 | 4/1989 | Voinis et al. | 264/272.17 |
| 5,614,131 | 3/1997 | Mukerji et al. | 264/1.9 |
| 5,635,115 | 6/1997 | Konishi et al. | 264/1.9 |

*Primary Examiner*—Mathieu D. Vargot
*Attorney, Agent, or Firm*—Finnegan, Henderson, Farabow, Garrett & Dunner, L.L.P.

[57]                ABSTRACT

In manufacturing an optical semiconductor device, light-emitting elements are mounted on their respective printed boards of an insulating plate with a silver paste interposed therebetween. A sealing mold having a shape (a lens forming portion) necessary for forming a projected lens is adhered to the major surface of the insulating plate in accordance with each of the light-emitting elements of each of the printed boards. A liquid epoxy resin having a melt viscosity of 100 Pa·s to 200 Pa·s is continuously injected into the sealing mold with the lens forming portion of the sealing mold downward. The liquid epoxy resin is then hardened to form a projected, domed lens on each of the light-emitting elements. After that, the sealing mold is removed, and the insulating plate is separated for each of the light-emitting elements into surface-mounted optical semiconductor devices each having a projected, domed lens. Consequently, a lens having a large diameter can be formed in a short time, thereby increasing in luminance and improving in yield and quality, without increasing in manufacturing costs.

22 Claims, 4 Drawing Sheets

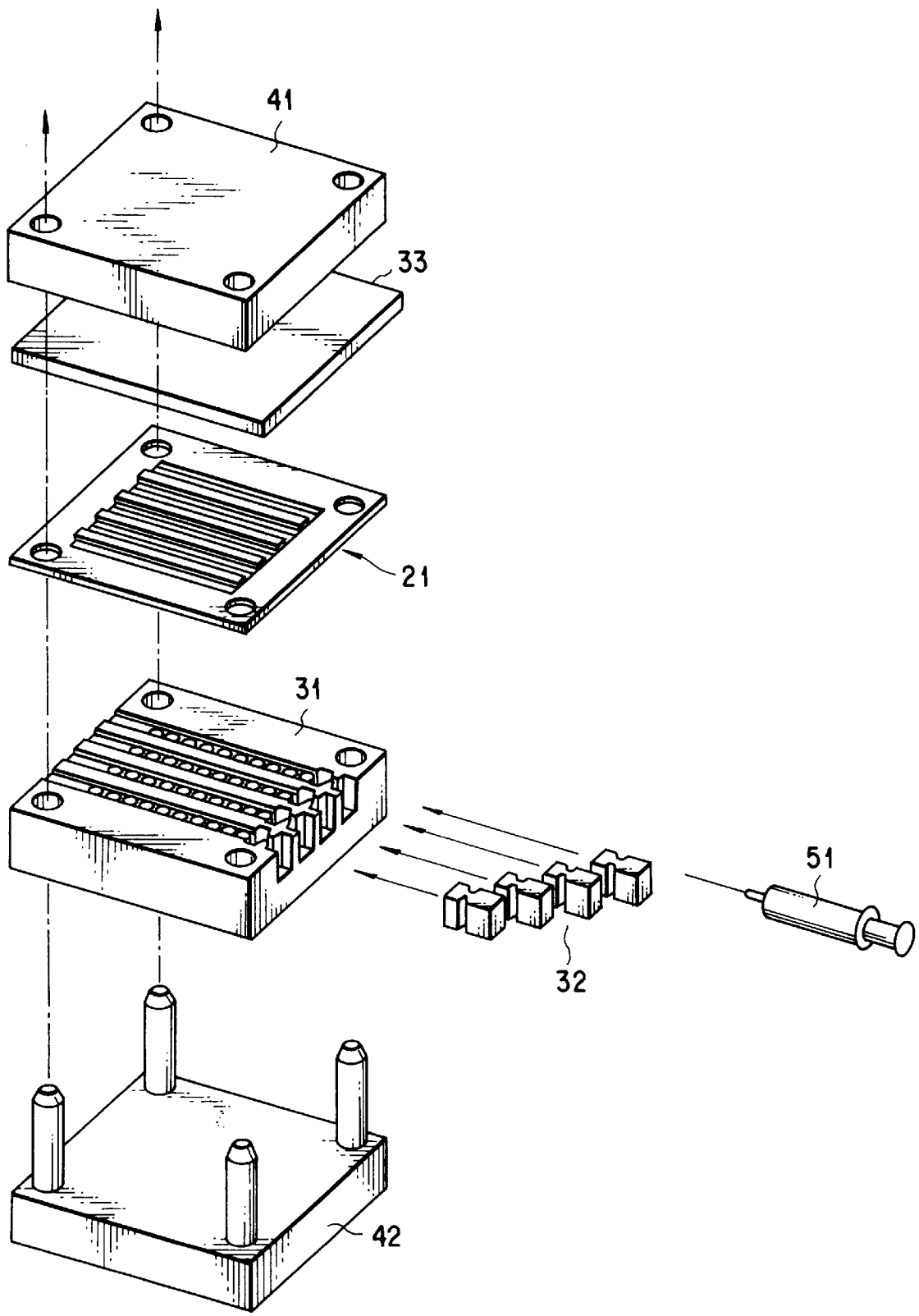
F I G. 5

METHOD FOR MANUFACTURING A SURFACE-MOUNTED TYPE OPTICAL SEMICONDUCTOR DEVICE

BACKGROUND OF THE INVENTION

1. Field of the Invention

The present invention relates to a method for manufacturing a surface-mounted optical semiconductor device and, more particularly, to a method for manufacturing a surface-mounted optical semiconductor device having a projected, domed lens.

2. Description of the Related Art

Conventionally, a surface-mounted optical semiconductor device having a flat structure has been produced.

FIG. 1 is cross-sectional view schematically showing a prior art surface-mounted optical semiconductor device having a flat structure. In this prior art device, a light-emitting element 103 is fixed to a mounting portion of the surface of a printed board 101 with a silver paste 102 interposed therebetween. The printed board 101 is provided with a wiring 104 and an external lead section 105. One end of the external lead section 105 is connected to the wiring 104 on the surface of the printed board 101 (not shown). The other end of the external lead section 105 is extended to the edge portion of the undersurface of the printed board 101 through the side of the printed board 101. The light-emitting element 103 and wiring 104 are electrically coupled to each other by means of a wire 106. The light-emitting element 103, including the wire 106, on the printed board 101 is sealed with an epoxy resin 107 whose top face is flat.

However, the flat-structure type surface-mounted optical semiconductor device has the drawback that the luminance of the light-emitting element 103 is very low since the element 103 is simply sealed with the epoxy resin 107. To resolve the drawback and improve the characteristic of the device (to increase the luminance), a surface-mounted optical semiconductor device having an inner lens on the surface thereof, has been developed.

FIGS. 2A and 2B schematically show the constitution of a surface-mounted optical semiconductor device with an inner lens. FIG. 2A is a perspective view of the outward appearance of the device, while FIG. 2B is a cross-sectional view thereof.

Referring to FIGS. 2A and 2B, a light-emitting element 203 is fixed to a mounting portion of the surface of a printed board 201 with a silver paste 202 interposed therebetween. The printed board 201 is provided with a wiring 204 and an external lead section 205. One end of the external lead section 205 is connected to the wiring 204 on the surface of the printed board 201 (not shown). The other end of the external lead section 205 is extended to the edge portion of the undersurface of the printed board 201 through the side of the printed board 201. The light-emitting element 203 and wiring 204 are electrically coupled to each other by means of a wire 206. The light-emitting element 203, including the wire 206, on the printed board 201 is sealed with an epoxy resin 207 having a hemispherical inner lens 207a.

The above-described surface-mounted optical semiconductor device with an inner lens is generally manufactured through the following process. This process will be described with reference to FIG. 3.

An insulating plate 211 has a plurality of openings 211a arranged in rows, and a plurality of printed boards 201 are formed between adjacent openings 211a. A wiring 204 and an external lead section 205 are formed in advance on each of the printed boards 201.

First a light-emitting element 203 is fixed onto each of the printed boards 201 through a silver paste 202 and then bonded to the wiring 204 by a wire 206. After that, a mold (not shown) is adhered to the top surface of the insulating plate 211, and an epoxy resin 207 is injected into the mold. The mold has a shape necessary for forming the epoxy resin 207 and inner lens 207a for each light-emitting element, and the epoxy resin can be continuously supplied to the respective printed boards 201 (a transfer mold having a through-gate structure). The epoxy resin 207 can be replaced with, for example, a tablet-like epoxy resin.

The epoxy resin is heated and hardened, and the insulating plate 211 is removed from the mold (FIG. 3 shows the mold from which the insulating plate 211 is removed). The light-emitting elements 203 on the respective printed boards 201 are sealed at once with the epoxy resin 207, and the printed boards 201 are separated by dicing into surface-mounted optical semiconductor devices each having an inner lens, as shown in FIGS. 2A and 2B.

Due to the lens effect, the surface-mounted optical semiconductor device so manufactured has luminance about two times higher than that of the surface-mounted optical semiconductor device having a flat structure. However, the luminance of the device with an inner lens does not sufficiently meet the needs of the semiconductor market, and a higher luminance is still demanded.

The diameter of the inner lens has only to be increased in order to heighten the luminance; however, there is a limit to the diameter of the lens. In the through-gate structure transfer mold, since the resin is continuously supplied, if the lens is increased in diameter, bubbles are easy to generate on the lens. The large diameter thus makes it more difficult to manufacture the device. The bubbles can be prevented from generating, if the mold is formed so as to have a so-called separate gate structure in which a supply port is provided for each of the printed boards to supply the resin therefrom. This method, however, necessitates arranging runner gates in the printed boards, which notably decreases the utility efficiency of the printed boards and increases the manufacturing costs.

The melt viscosity of the tablet-like epoxy resin used in the transfer mold is generally increased during its injection. It is thus likely that the wire will be deformed by the pressure and speed at which the resin is injected, and the method and conditions for the injection greatly affect the quality and yield of the products.

SUMMARY OF THE INVENTION

An object of the present invention is to provide a method for manufacturing an optical semiconductor device capable of increasing in luminance and improving in yield and quality, without increasing in cost.

To attain the object, according to a first aspect of the present invention, there is provided a method for manufacturing an optical semiconductor device, wherein a sealing mold is adhered to a major surface of an insulating substrate mounted with an optical semiconductor element, and a liquid resin is injected into the sealing mold and hardened, thereby to form a projected, domed lens on the optical semiconductor element.

According to a second aspect of the present invention, there is provided a method for manufacturing an optical semiconductor device, wherein a sealing mold is adhered to a major surface of each of insulating substrates mounted with a plurality of optical semiconductor elements, and a liquid resin is continuously injected into the sealing mold and hardened, thereby forming a projected, domed lens on each of the optical semiconductor elements.

According to a third aspect of the present invention, there is provided a method for manufacturing an optical semiconductor device, comprising the steps of:

mounting an optical semiconductor element on each of insulating substrates;

adhering a sealing mold having a dome-shaped portion to a major surface of each of the insulating substrates;

continuously injecting a liquid resin into the dome-shaped portion of the sealing mold;

hardening the liquid resin to form a projected, domed lens on the optical semiconductor element; and removing the sealing mold, and separating the insulating substrates, each including the optical semiconductor element, from one another.

With the foregoing method for manufacturing an optical semiconductor device of the present invention, since a liquid resin is employed, the method and conditions for injecting the liquid resin can easily be optimized and accordingly the bubbles generated on the lenses can be greatly reduced. Consequently, a lens with a large diameter can be formed in a short time by the transfer mold of through-gate structure, and a high luminance can be achieved without increasing in costs.

Furthermore, the liquid resin is not affected by its injecting pressure or speed but can prevent the wire from being deformed, thus improving in quality and yield as well as increasing in luminance.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIG. 5 is a schematic view for explaining a method for manufacturing the surface-mounted optical semiconductor device with a projected, domed lens.

DETAILED DESCRIPTION OF THE PREFERRED EMBODIMENT

An embodiment of the present invention will now be described with reference to the accompanying drawings.

Figure 1:
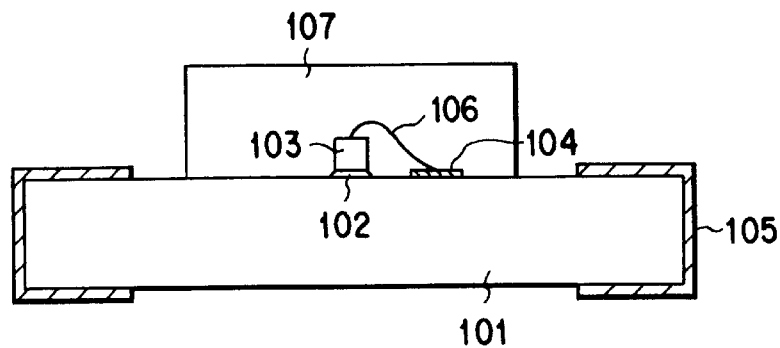
FIG. 1 is a schematic cross-sectional view showing a prior art surface-mounted optical semiconductor device having a flat structure, for explaining the problems of the prior art device.
Figure 2A:
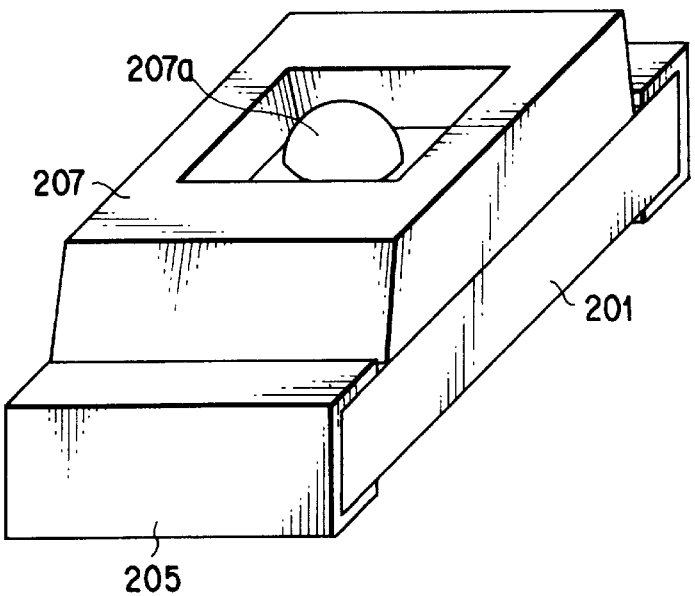
FIGS. 2A and 2B are schematic views showing the constitution of a prior art surface-mounted optical semiconductor device with an inner lens.
Figure 2B:
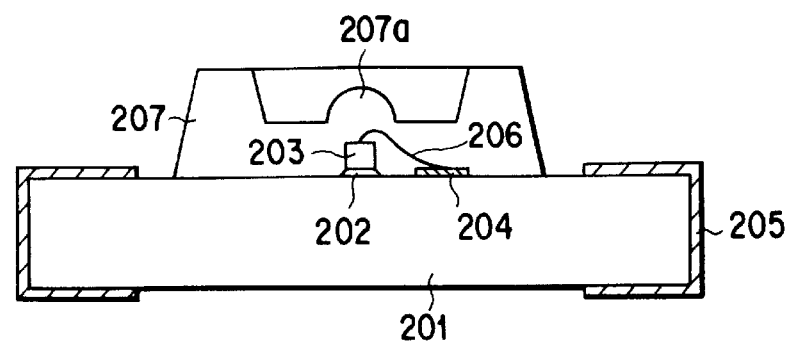
Figure 3:
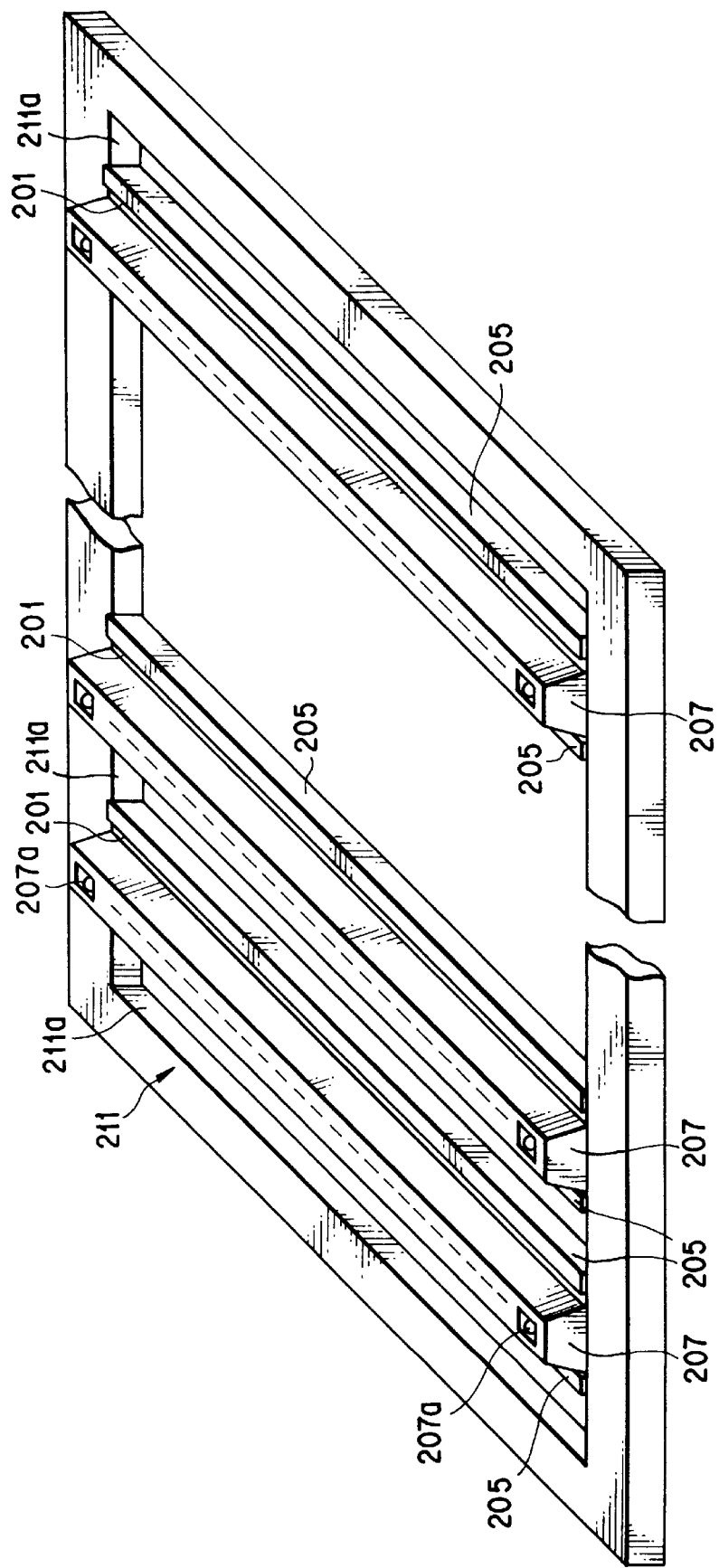
FIG. 3 is a schematic view of the prior art surface-mounted optical semiconductor device with an inner lens, for explaining a method for manufacturing the same.
Figure 4:
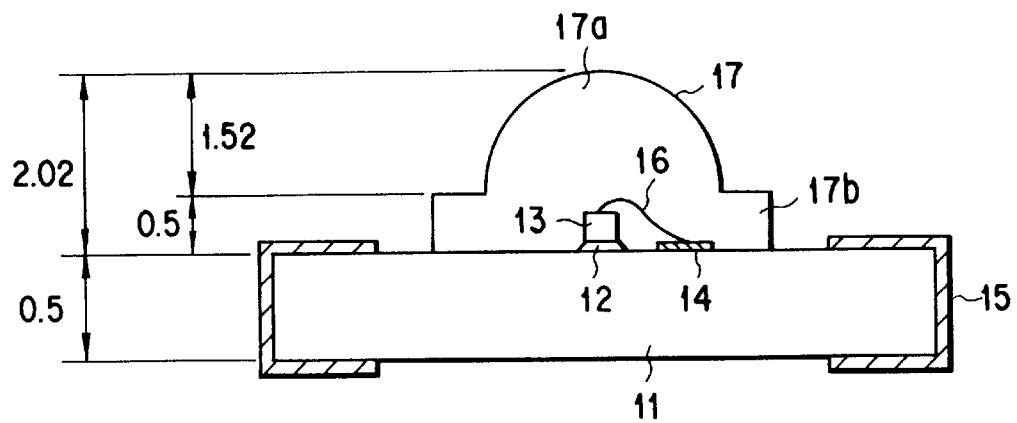
FIG. 4 is a schematic cross-sectional view showing the constitution of a surface-mounted optical semiconductor device with a projected, domed lens according to an embodiment of the present invention.

FIG. 4 is a schematic cross-sectional view showing the constitution of a surface-mounted optical semiconductor device with a projected, domed lens according to the embodiment of the present invention.

In this semiconductor device, a light-emitting element (optical semiconductor element) 13 is fixed to a mounting portion of the surface of a printed board (insulating substrate) 11 formed of, e.g., BT (Bismaleimide and Triazine) resin, with a silver paste 12 interposed therebetween. The printed board 11 is provided with a wiring 14 and an external lead section (external lead terminal) 15. The external lead section 15 is constituted by plating or the like, and its one end is connected to the wiring 14 on the surface of the printed board 11 (not shown), while the other end is extended to the edge portion of the undersurface of the printed board 11 through the side of the printed board 11. The light-emitting element 13 and wiring 14 are electrically coupled to each other by means of a wire 16. The light-emitting element 13, including the wire 16, on the printed board 11 is sealed with a domed lens (projected lens) 17a and a flange 17b both formed of liquid epoxy resin 17. It is desirable that the height of the domed lens 17a be 0.5 mm or more.

In the above optical semiconductor device with a projected, domed lens, for example, the printed board 11 is 0.5 mm in thickness, the light-emitting element 13 is 0.3 by 0.3 millimeter square, the flange 17b is 0.5 mm in thickness, and the domed lens 17a is 1.52 mm (radius=1.0 mm) in height. If the optical outputs of light-emitting elements are the same, the luminance of the semiconductor device can be about five times higher than that of the prior art device having a flat structure and about 2.5 times higher than that of the prior art device with an inner lens, by virtue of the lens effect of the domed lens 17a.

A method for manufacturing the foregoing surface-mounted optical semiconductor device with a projected, domed lens, will now be described with reference to FIG. 5.

In manufacturing a semiconductor device with a projected, domed lens, an insulating plate 21 having a plurality of openings arranged in rows and a plurality of printed boards 11 formed between adjacent openings, is employed, as in the case of the prior art surface-mounted optical semiconductor device with an inner lens. Each of the printed boards 11 is provided in advance with a wiring 14 and an external lead section 15.

First, a light-emitting element 13 is fixed onto each of the printed boards 11 with a silver paste 12 interposed therebetween, and then bonded to the wiring 14 by means of a wire 16.

After that, a sealing mold 31 is adhered to the major surface (element mounting surface) of the insulating plate 21 by pressure, with the major surface downward. The sealing mold 31 is formed so as to have a shape (cavity) necessary for forming a domed lens 17a and a flange 17b for each light-emitting element 13. The sealing mold 31 is formed of metal or resin such as noncrystalline polyolefine, and the liquid epoxy resin 17 can be continuously supplied to the respective printed boards 11 (through-gate structure transfer mold). Furthermore, the sealing mold 31 includes a bush 32 for preventing the liquid epoxy resin 17 from flowing backward when the resin 17 is supplied.

After the sealing mold 31 incorporating the bush 32 is adhered to the major surface of the insulating plate 21, a silicon rubber 33 for preventing the resin from leaking because of different thicknesses of the printed boards 11, is mounted on the opposite surface of the insulating plate 21.

The insulating plate 21 mounted with the silicon rubber 33 is then interposed between clamps 41 and 42 and clamped at a pressure of about $7 \times 10^6$ Pa.

The insulating plate 21 clamped by the clamps 41 and 42 is heated to 50° C. to 60° C., and the liquid epoxy resin 17 having a melt viscosity of 100 Pa·s to 200 Pa·s is injected into the sealing mold 31 using a dispenser 51. The resin 17 is continuously supplied to each of the printed boards 11 and then the domed lens thereof without changing the viscosity.

Being injected into the sealing mold 31, the resin 17 is heated at a temperature of about 120° C. for about two hours and hardened. The clamps 41 and 42 are undone to remove the sealing mold 31, and the light-emitting elements 13 are sealed at once with the liquid epoxy resin 17, thus forming the domed lens 17a above each of the light-emitting elements 13. The printed board 11 with the domed lens 17a is separated by dicing into surface-mounted optical semiconductor devices each having a projected, domed lens, as shown in FIG. 4.

According to the surface-mounted optical semiconductor device with a projected, domed lens, so manufactured, the lens effect greatly improves the luminance without increasing the manufacturing cost too much. In other words, since the hardening speed of the liquid epoxy resin is lower than that of the prior art epoxy resin (tablet-like epoxy resin), the resin can be caused to sufficiently flow into the lens before it is hardened even in the through-gate structure transfer mold, and the bubbles generated on the lens can greatly be reduced.

Moreover, in this embodiment, since the lenses of the sealing mold 31 face downward, the resin flows into the lenses more smoothly.

Figure 6:
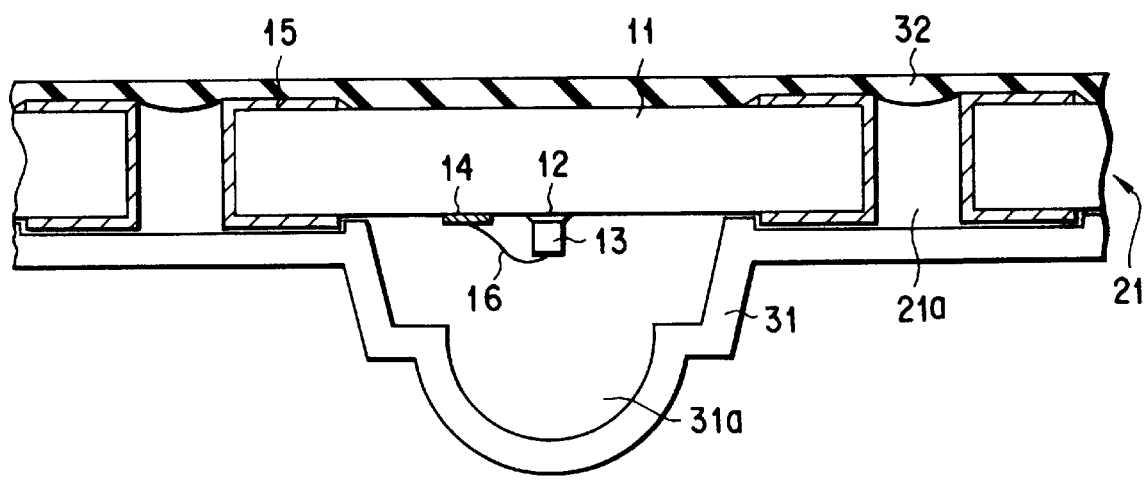
FIG. 6 is a schematic cross-sectional view for explaining the method for manufacturing the surface-mounted optical semiconductor device with a projected, domed lens.

FIG. 6 is a cross-sectional view showing the major part of the surface-mounted optical semiconductor device with a projected, domed lens, for explaining a method for manufacturing the same.

In manufacturing a surface-mounted optical semiconductor device with a projected, domed lens according to the present invention, liquid epoxy resin 17 is injected into a cavity 31a of a sealing mold 31, with the lens of the sealing mold 31 downward. The resin 17 can thus be supplied effectively to the lens, with the result that the bubbles generated on the lens can be greatly reduced and the resin can be injected in a short time.

Since the hardening of the resin 17 can be delayed during its injection, the resin injection pressure and speed can easily be controlled, thereby resolving the problem in which a wire 16 is deformed by the resin 17. It is thus possible to prevent the finished products from decreasing in quality and yield because of thinning and deformation of the wire 16.

As described above, if the liquid epoxy resin is employed, the method and conditions for injecting the resin can easily be optimized. More specifically, since the projected lens is formed on the light-emitting element using the liquid epoxy resin whose hardening speed is slower than that of the conventional tablet-like epoxy resin, the bubbles generated on the lens can be reduced in the through-gate structure transfer mold, and the lens can be formed in a short time even though its diameter is large. High luminance can thus be achieved without increasing in manufacturing costs.

Since, furthermore, the deformation of the wire or the like, due to the injection of the liquid epoxy resin, can be prevented, the yield can be improved and the quality can be stabilized.

In the above-described embodiment of the present invention, the light-emitting element is used as an optical semiconductor element. The present invention is not limited to the light-emitting element, but can be applied to an optical semiconductor device including a light-receiving element and to another optical semiconductor device such as a reflection type sensor including both a light-emitting element and a light-receiving element. In particular, the reflection type sensor can be decreased in malfunction and increased in reliability since a domed lens is formed on each of the light-emitting and light-receiving elements.

In the foregoing embodiment, the flange 17b is provided below the lens 17a in order to increase the adhesion of the lens 17a to the printed board 11 and to facilitate the pickup of the device when the device is mounted. However, it is not always necessary to form the flange 17b.

Needless to say, various changes and modifications can be made without departing from the scope of the subject matter of the present invention.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method for manufacturing a surface-mounted optical semiconductor device, comprising the steps of:
   mounting an optical semiconductor element on each of a plurality of insulating substrates;
   adhering a sealing mold for transfer molding, having a through-gate structure and a dome-shaped portion, to a major surface of each of said insulating substrates;
   continuously injecting a liquid epoxy resin having a melt viscosity of approximately 100 to 200 Pa·s into the dome-shaped portion of said sealing mold;
   hardening said liquid epoxy resin by thermal curing to form a projected, domed lens on said optical semiconductor element; and
   removing said sealing mold, and separating said insulating substrates from one another, wherein each insulating substrate includes said optical semiconductor element.

2. The method according to claim 1, wherein said optical semiconductor element includes one or both of a light-emitting element and a light-receiving element.

3. The method according to claim 1, wherein said sealing mold is selected from the group consisting of metal and resin.

4. The method according to claim 1, wherein the dome-shaped portion of said sealing mold faces downward.

5. The method according to claim 1, which further comprises a step of picking up said optical semiconductor device by holding up a flange which is provided below said domed lens, and mounting an external lead terminal on a surface of each of said insulating substrates.

6. A method for manufacturing a surface-mounted type optical semiconductor device, comprising the steps of:
   mounting a plurality of optical semiconductor elements on each of a plurality of insulating substrates;
   adhering a sealing mold for transfer molding, having a through-gate structure, to a major surface of each of said insulating substrates;
   continuously injecting a liquid epoxy resin having a melt viscosity of approximately 100 to 200 Pa·s into said sealing mold; and hardening said liquid epoxy resin by thermal curing to form a projected, domed lens on said optical semiconductor element.

7. The method according to claim 6, wherein said insulating substrates are arranged in rows between a plurality of openings formed in an insulating plate, and wherein wiring is electrically connected to each of said optical semiconductor elements on a major surface of each of said insulting substrates, and further wherein an external lead terminal is connected to the wiring through a side of each of said openings on an opposite surface of each of said insulating substrates.

8. The method according to claim 6, wherein each of said optical semiconductor elements includes one or both of a light-emitting element and a light-receiving element.

9. The method according to claim 6, wherein said sealing mold has a dome-shaped portion corresponding to each of said optical semiconductor elements mounted on each of said insulating substrates.

10. The method according to claim 6, wherein the dome-shaped portion of said sealing mold, faces downward.

11. The method according to claim 6, wherein said domed lens has a radius of approximately 1.0 mm formed above a flange.

12. A method for manufacturing a surface-mounted optical semiconductor device, comprising the steps of:

mounting an optical semiconductor element on an insulating substrate;

adhering a sealing mold for transfer molding, having a through-gate structure and a dome-shaped portion, to a major surface of said insulating substrate;

continuously injecting a liquid epoxy resin having a melt viscosity of approximately 100 to 200 Pa·s into the dome-shaped portion of said sealing mold;

hardening said liquid epoxy resin by thermal curing to form a projected, domed lens on said optical semiconductor element; and removing said sealing mold.

13. The method according to claim 12, wherein said optical semiconductor element includes one or both of a light-emitting element and a light-receiving element.

14. The method according to claim 12, wherein said sealing mold is selected from the group consisting of metal and resin.

15. The method according to claim 12, wherein the dome-shaped portion of said sealing mold faces downward.

16. The method according to claim 12, which further comprises a step of picking up said optical semiconductor device by holding up a flange which is provided below said domed lens, and mounting an external lead terminal on a surface of said insulating substrate.

17. A method for manufacturing a surface-mounted optical semiconductor device, comprising the steps of:

mounting a plurality of optical semiconductor elements on an insulating substrate;

adhering a sealing mold for transfer molding, having a through-gate structure, to a major surface of said insulating substrate;

continuously injecting a liquid epoxy resin having a melt viscosity of approximately 100 to 200 Pa·s into said sealing mold;

hardening said liquid epoxy resin by thermal curing to form a projected, domed lens on said optical semiconductor element.

18. The method according to claim 17, wherein said at least one insulating substrate is arranged in a an opening formed in an insulating plate, and wherein wiring is electrically connected to each of said optical semiconductor elements on a major surface of said insulting substrate, and further wherein an external lead terminal is connected to the wiring through a side of each of said openings on an opposite surface of said at least one insulating substrate.

19. The method according to claim 17, wherein each of said optical semiconductor elements includes one or both of a light-emitting element and a light-receiving element.

20. The method according to claim 17, wherein said sealing mold has a dome-shaped portion corresponding to each of said optical semiconductor elements mounted on said at least one insulating substrate.

21. The method according to claim 17, wherein a dome-shaped portion of said sealing mold, faces downward.

22. The method according to claim 17, wherein said domed lens has a radius of approximately 1.0 mm formed above a flange.

* * * * *

UNITED STATES PATENT AND TRADEMARK OFFICE
CERTIFICATE OF CORRECTION

PATENT NO. : 5,851,449
DATED : December 22, 1998
INVENTOR(S) : Tuguo Uchino et al.

It is certified that error appears in the above-identified patent and that said Letters Patent is hereby corrected as shown below:

\*Claim 6, Col. 6, line 58, after "surface-mounted", delete "type".

Claim 7, Col. 7, line 8, "insulting" should read --insulating--.

\*Claim 10, Col. 7, line 20, after "wherein", "the" should read --a--.

\*Claim 10, Col. 7, line 21, after "mold", delete ",".

Claim 18, Col. 8, line 24, before "an opening", delete "a".

Claim 18, Col. 8, line 27, "insulting" should read --insulating--.

\*Claim 21, Col. 8, line 39, after "mold", delete ",".

Signed and Sealed this

Eighth Day of February, 2000

Attest:

Attesting Officer

Q. TODD DICKINSON

Commissioner of Patents and Trademarks